(12) United States Patent
Li et al.

(10) Patent No.: US 11,908,888 B2
(45) Date of Patent: Feb. 20, 2024

(54) METAL-INSULATOR-METAL CAPACITOR STRUCTURE SUPPORTING DIFFERENT VOLTAGE APPLICATIONS

(71) Applicant: International Business Machines Corporation, Armonk, NY (US)

(72) Inventors: Baozhen Li, South Burlington, VT (US); Chih-Chao Yang, Glenmont, NY (US); Nan Jing, Fishkill, NY (US); Huimei Zhou, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 17/482,565

(22) Filed: Sep. 23, 2021

(65) Prior Publication Data

US 2023/0088799 A1 Mar. 23, 2023

(51) Int. Cl.
*H01L 49/02* (2006.01)

(52) U.S. Cl.
CPC .................................. *H01L 28/60* (2013.01)

(58) Field of Classification Search
CPC .............. H01L 27/1255; H01L 27/016; H01L 28/86–88; H01L 28/91
See application file for complete search history.

(56) References Cited

U.S. PATENT DOCUMENTS

| | | | |
|---|---|---|---|
| 7,041,569 B1 | 5/2006 | Kar-Roy et al. | |
| 7,154,162 B2 * | 12/2006 | Ahn | H01L 27/0805 |
| | | | 257/532 |
| 7,981,761 B2 | 7/2011 | Imai et al. | |
| 7,986,532 B2 | 7/2011 | Palanduz et al. | |
| 8,143,699 B2 | 3/2012 | Ching et al. | |
| 8,375,539 B2 * | 2/2013 | Dunn | H01L 27/0805 |
| | | | 29/25.03 |
| 8,487,406 B2 | 7/2013 | Darabi et al. | |
| 8,729,666 B2 | 5/2014 | Stribley et al. | |
| 8,857,022 B2 * | 10/2014 | Dunn | H01L 23/5223 |
| | | | 29/25.03 |
| 9,312,326 B2 * | 4/2016 | Jakushokas | H01L 28/60 |
| 9,466,661 B2 * | 10/2016 | Triyoso | H01L 28/60 |
| 10,580,581 B2 * | 3/2020 | Fox, III | H01G 4/33 |
| 2011/0032660 A1 * | 2/2011 | Dunn | H01L 23/5223 |
| | | | 257/532 |
| 2020/0013770 A1 * | 1/2020 | Elsherbini | H01L 28/91 |
| 2021/0151345 A1 * | 5/2021 | Liang | H01L 21/707 |
| 2021/0249348 A1 * | 8/2021 | Li | H01L 28/60 |
| 2022/0384563 A1 * | 12/2022 | Kim | H01L 23/5223 |

FOREIGN PATENT DOCUMENTS

| | | |
|---|---|---|
| DE | 10348902 B4 | 8/2010 |
| KR | 100689819 B1 | 3/2007 |
| WO | 2018004651 A1 | 1/2018 |

* cited by examiner

*Primary Examiner* — Vincent Wall
(74) *Attorney, Agent, or Firm* — CANTOR COLBURN LLP; L. Jeffrey Kelly

(57) ABSTRACT

A metal-insulator-metal (MIM) capacitor structure includes a substrate extending along a first direction to define a length, a second direction orthogonal to the first direction to define a width, and a third direction orthogonal to the first and second direction to define a height. The substrate includes a first capacitance region and a second capacitance region. The first capacitance region has a first maximum operating voltage (Vmax) and the second capacitance region has a second Vmax that is greater than the first Vmax.

6 Claims, 10 Drawing Sheets

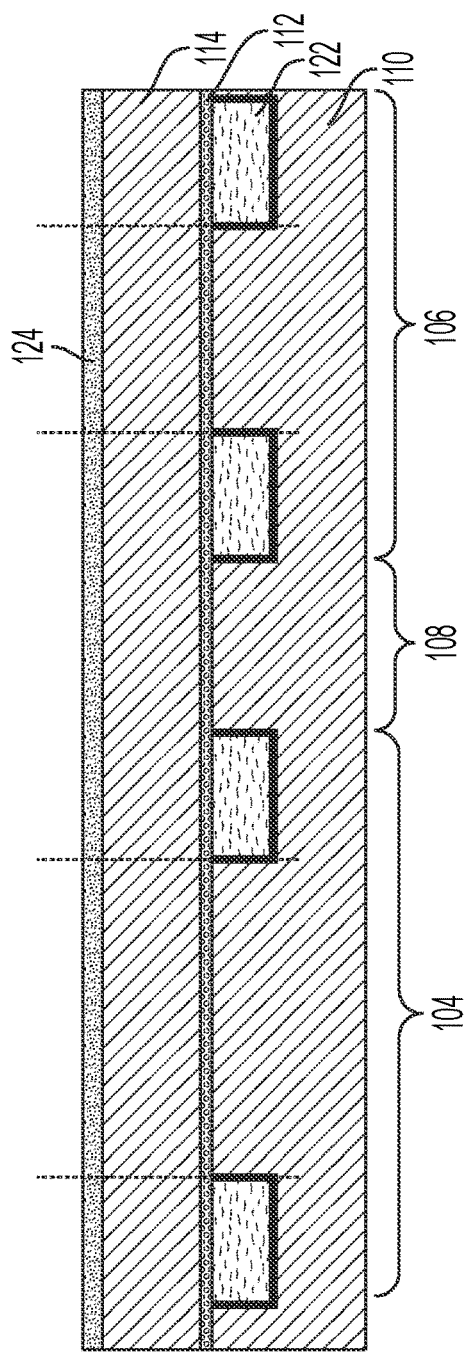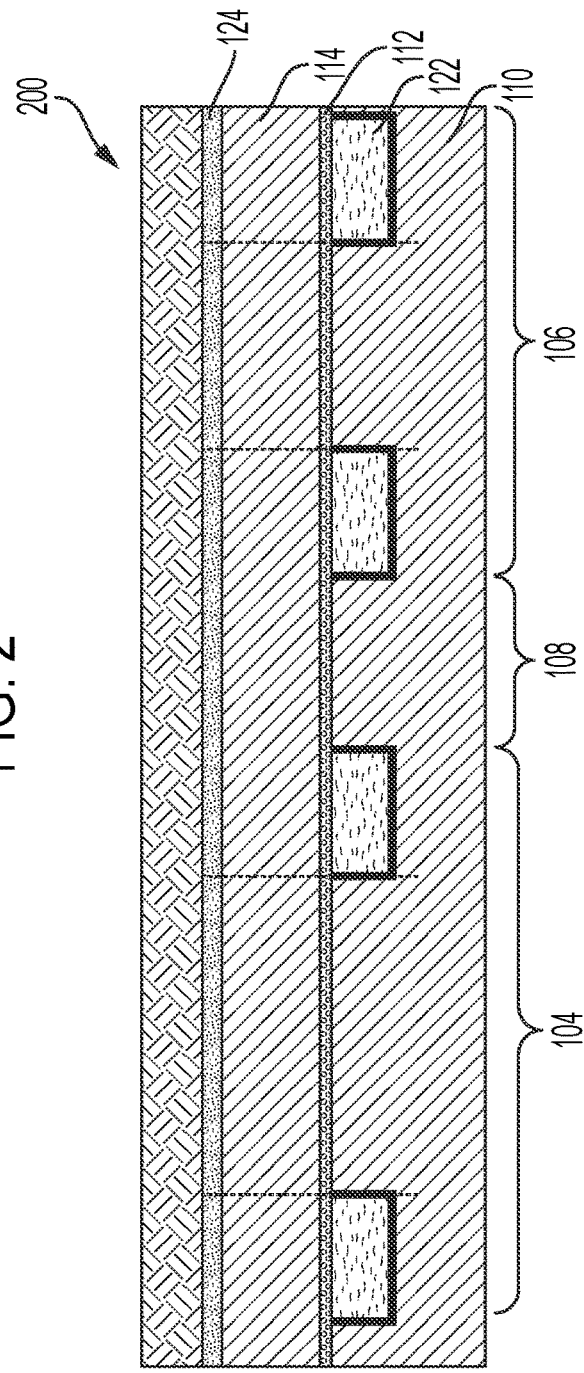

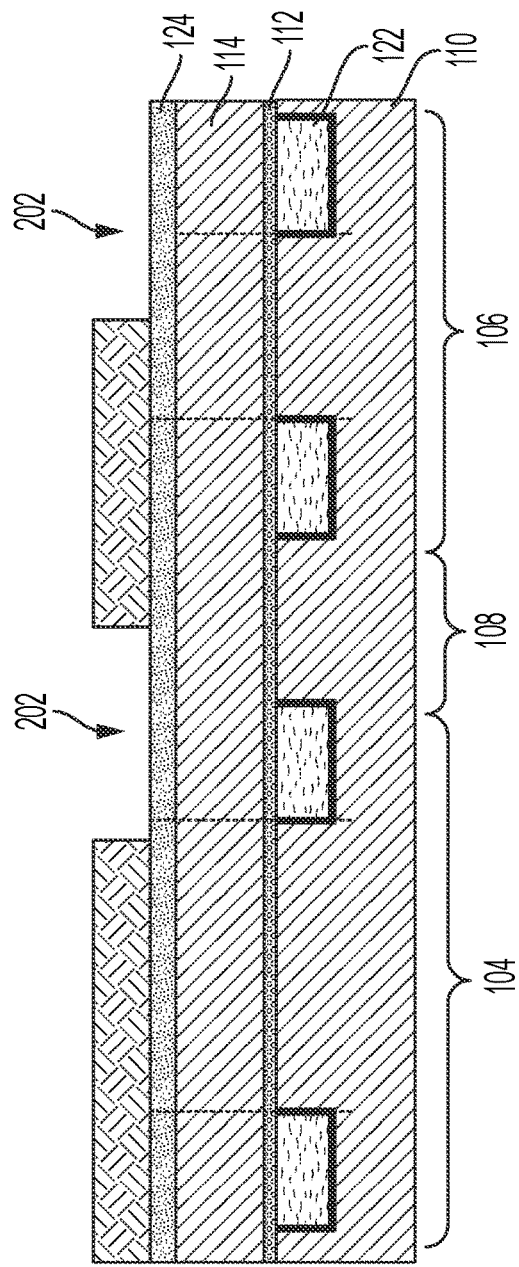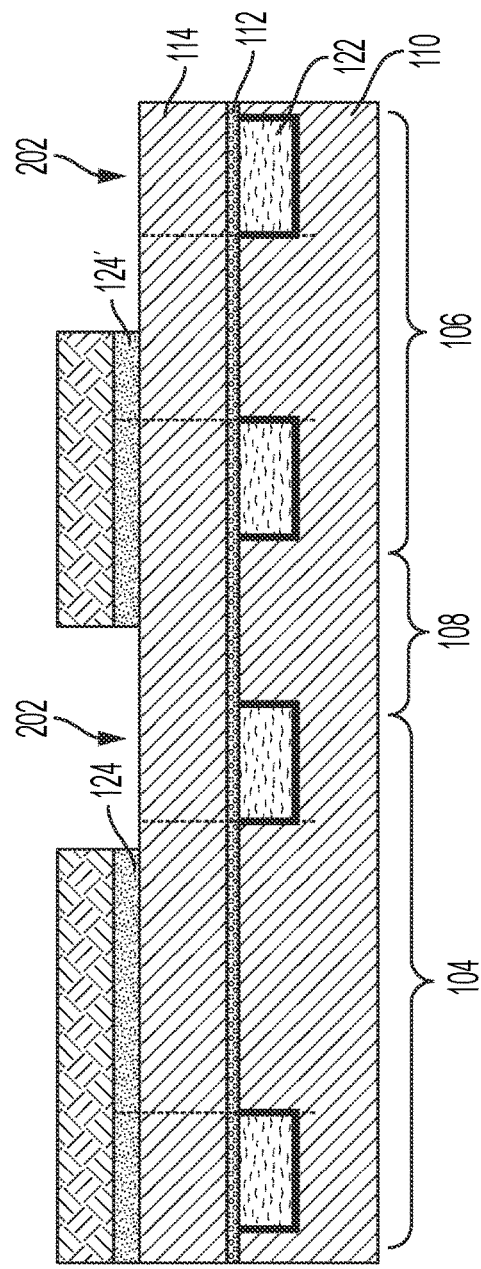

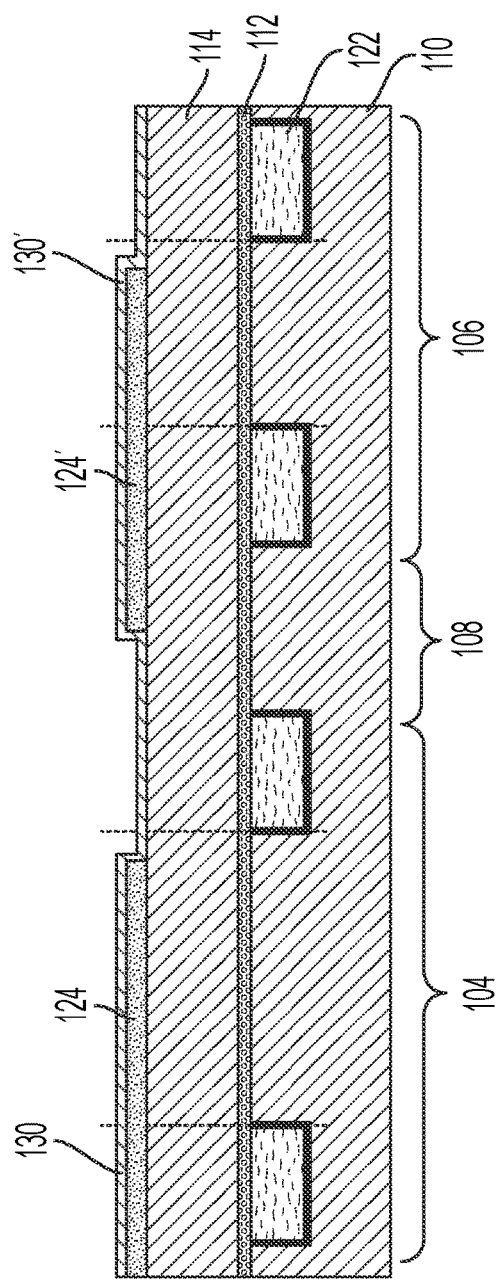
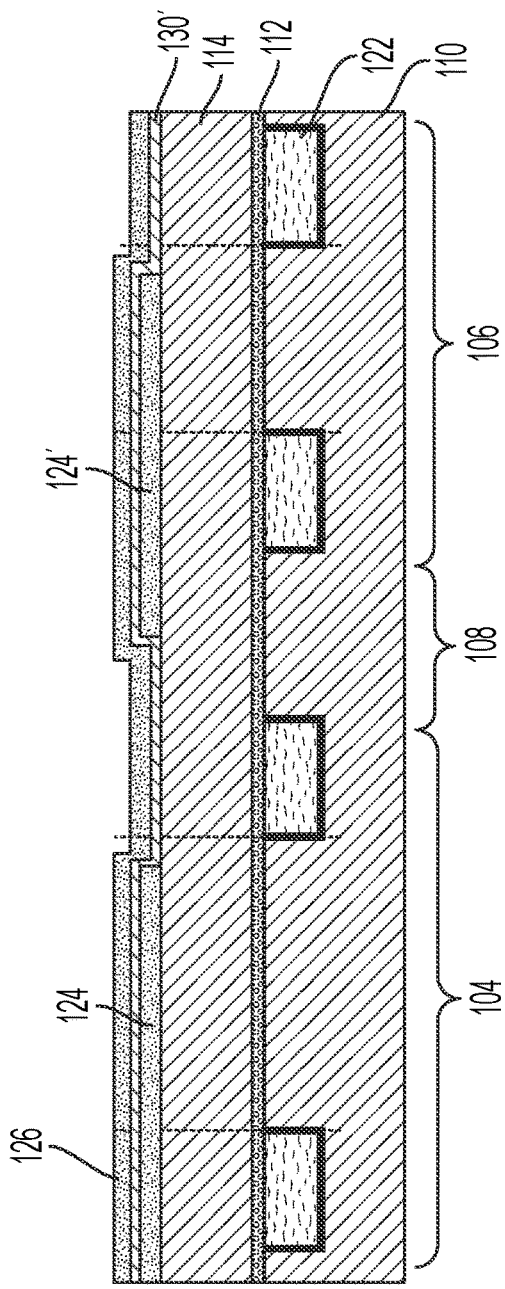

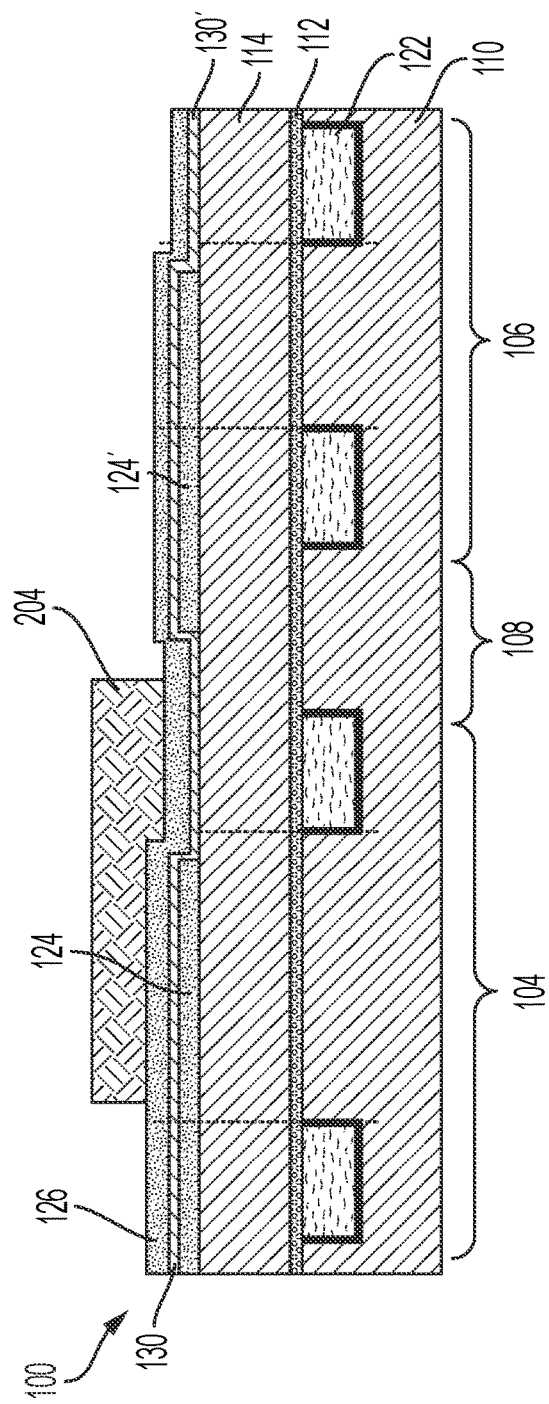
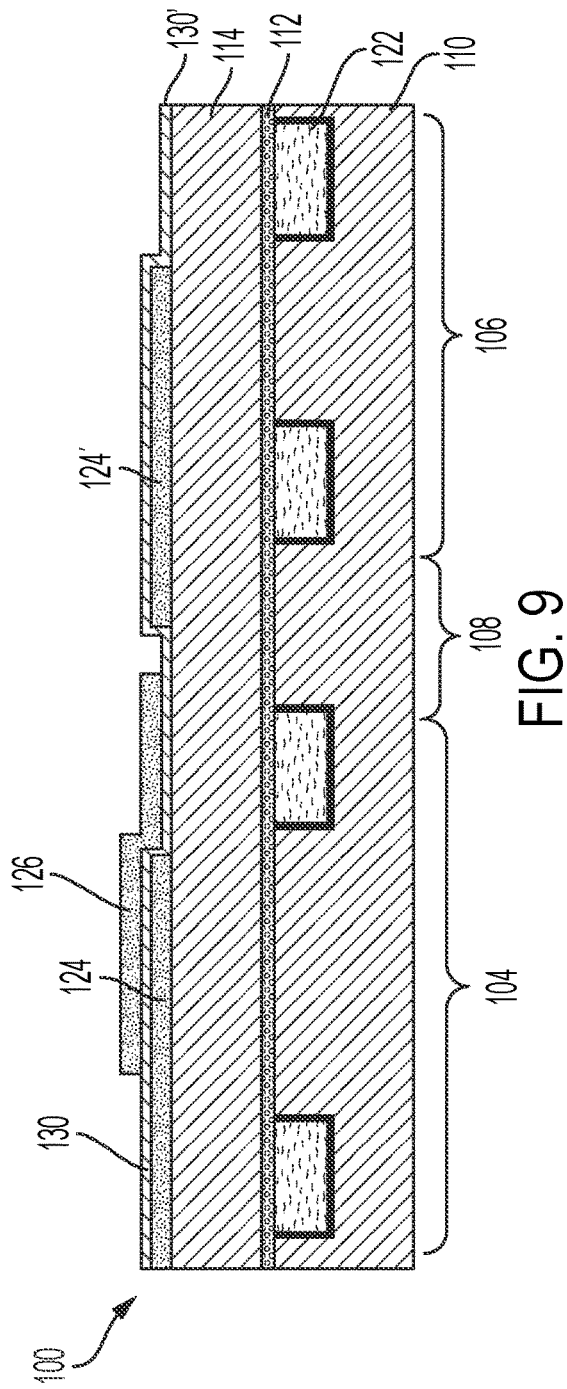

METAL-INSULATOR-METAL CAPACITOR STRUCTURE SUPPORTING DIFFERENT VOLTAGE APPLICATIONS

BACKGROUND

The present invention generally relates to semiconductor integrated circuits, and more particularly to a semiconductor metal-insulator-metal capacitor, and method for fabricating the same.

A metal-insulator-metal (MIM) capacitor (sometimes referred to as a "MIMCAP") is a structure that includes electrically conductive material layers (often referred to as "plates") separated and insulated from each other by an insulator material (e.g., dielectric layer) for storing a charge. MIM capacitors typically provide low voltage coefficients and a low series resistance, and therefore are often used in complementary metal-oxide-semiconductor (CMOS) applications.

SUMMARY

According to a non-limiting embodiment, a metal-insulator-metal (MIM) capacitor structure includes a substrate extending along a first direction to define a length, a second direction orthogonal to the first direction to define a width, and a third direction orthogonal to the first and second direction to define a height. The substrate includes a first capacitance region and a second capacitance region. The first capacitance region has a first maximum operating voltage (Vmax) and the second capacitance region has a second Vmax that is greater than the first Vmax.

According to another non-limiting embodiment, a method of fabricating a metal-insulator-metal (MIM) capacitor structure is provided. The method includes forming a substrate including a first capacitance region and a second capacitance region, and forming a first capacitor stack having a first maximum operating voltage (Vmax) in the first capacitance region. The method further comprises forming a second capacitor stack having a second Vmax in the second capacitance region such that the second Vmax is different from the first Vmax.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2-14 are a series of views illustrating a method of fabricating a MIM capacitor structure according to non-limiting embodiments of the present disclosure, in which:

FIG. 2 depicts a cross-sectional view of an intermediate MIM capacitor structure following various intermediate processing operations to deposit a first conformal plate layer shared between first and second capacitance regions according to a non-limiting embodiment of the present disclosure;

FIG. 3 depicts the MIM capacitor structure following deposition of a masking layer on an upper surface of the first conformal plate layer according to a non-limiting embodiment of the present disclosure;

FIG. 4 depicts the MIM capacitor structure after patterning the masking layer to expose one or more portions of the underlying conformal plate layer according to a non-limiting embodiment of the present disclosure;

FIG. 5 depicts the MIM capacitor structure after removing the exposed portions of the underlying conformal plate layer according to a non-limiting embodiment of the present disclosure;

FIG. 6 depicts the MIM capacitor structure following deposition of a first conformal insulator layer according to a non-limiting embodiment of the present disclosure;

FIG. 7 depicts the MIM capacitor structure following deposition of a second conformal plate layer on the upper surface of the first conformal insulator layer according to a non-limiting embodiment of the present disclosure;

FIG. 8 depicts the MIM capacitor structure after patterning a masking layer to expose portions of the underlying second conformal plate layer according to a non-limiting embodiment of the present disclosure;

FIG. 9 depicts the MIM capacitor structure after removing exposed portions of the second conformal plate layer according to a non-limiting embodiment of the present disclosure;

FIG. 10 depicts the MIM capacitor structure following deposition of a second conformal insulator layer according to a non-limiting embodiment of the present disclosure;

FIG. 11 depicts the MIM capacitor structure following deposition of a third conformal plate layer on the upper surface of the second conformal insulator layer according to a non-limiting embodiment of the present disclosure;

FIG. 12 depicts the MIM capacitor structure after patterning a masking layer to expose portions of the underlying third conformal plate layer according to a non-limiting embodiment of the present disclosure;

FIG. 13 depicts the MIM capacitor structure after removing portions of the exposed third conformal plate layer according to a non-limiting embodiment of the present disclosure; and FIG. 14 depicts a completed MIM capacitor structure including first and second capacitance regions having different Vmax levels according to a non-limiting embodiment of the present disclosure.

Figure 1:
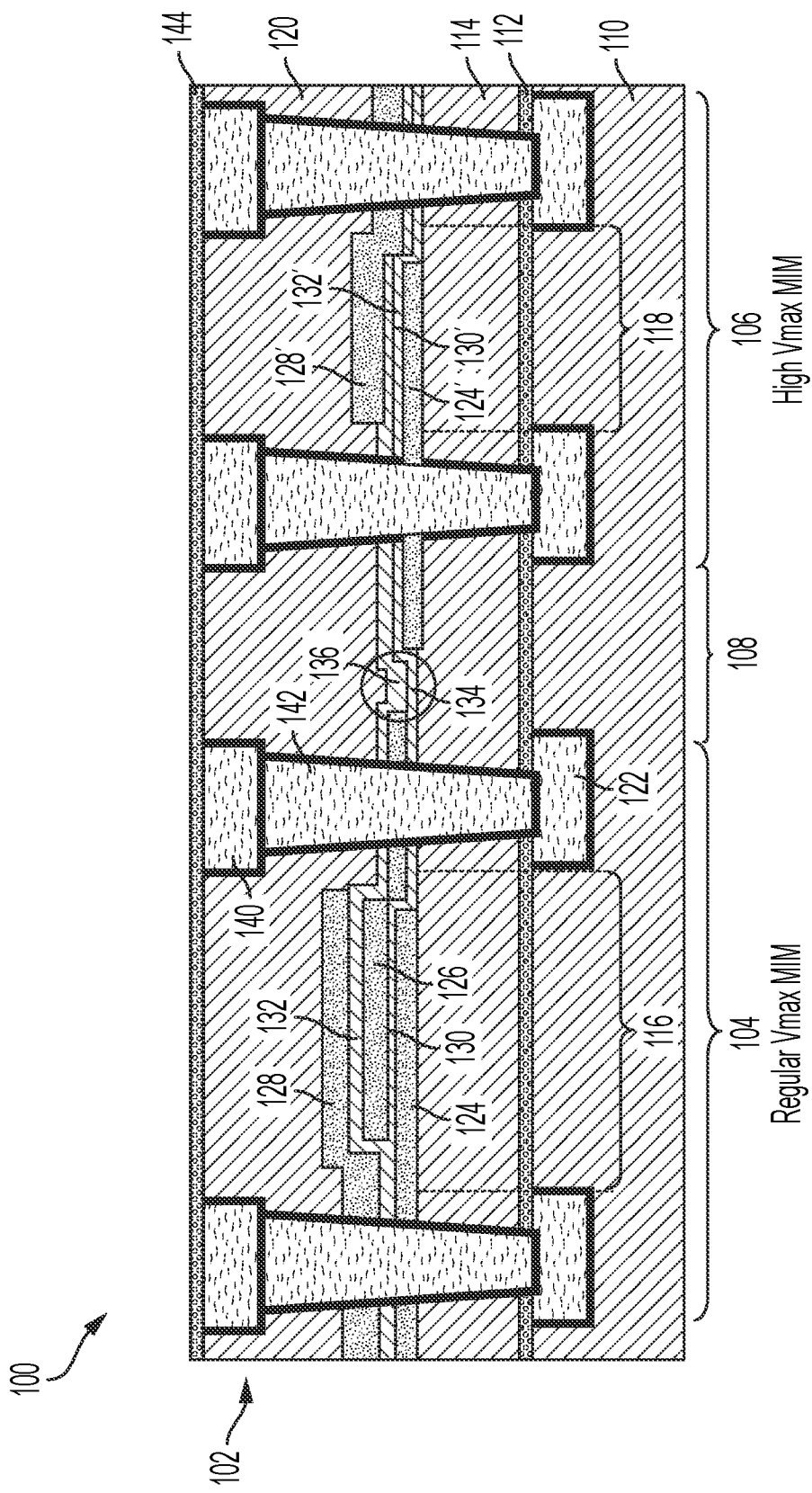
FIG. 1 is a block diagram illustrating a MIM capacitor structure according to a non-limiting embodiment of the present disclosure.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of the technologies that are more specifically relevant to aspects of the present invention, advancements in CMOS technologies have facilitated the production of semiconductor devices that implement increased transistor switching speeds with higher device densities on a semiconductor wafer. Large current spikes can occur due to a large number of "simultaneous" switching events in the circuit within a short period of time, which can cause considerable current-resistance drops and noise over the power supply network. Voltage fluctuations and power supply noise can impact the signal integrity, speed, and reliability of these devices. To mitigate high frequency noise in high-speed semiconductor technologies, the implementation of on-chip metal-insulator-metal decoupling capacitors MIM capacitors have become common. The MIM capacitors can compensate for voltage fluctuations and noise by delivering charges to the power-supply network and minimizing noise propagation.

MIM capacitors are known for their low voltage coefficients and a low series resistance. CMOS devices, however, typically employ a multitude of circuits designed to perform different functionalities. Therefore, MIM capacitors capable of supporting both low voltage applications and high voltage applications (referred to herein as Vmax levels or simply "Vmaxs". The Vmax refers the maximum operating voltage a capacitor can take with a given reliability and lifetime target. For instance, a CMOS device may incorporate some circuits designed to operate at a low Vmax, e.g., about 1 volt (V), while other circuits such as input/output (I/O) circuits, for example, require a much higher Vmax, such as, for example, 2.5V or even 3.3V. Current solutions for providing a MIM capacitor structure that can operate at higher Vmax levels include arranging multiple low Vmax MIM capacitors in series. This strategy, however, is disadvantageous in terms of area utilization, routing and defect sensitivity.

Various non-limiting embodiments described herein provide a MIM capacitor structure with a plurality of capacitance regions that are decoupled from one another. In this manner, a single MIM capacitor structure as described herein can support various different voltage applications, e.g., different Vmax levels associated with different circuits included in a CMOS device. For example, the MIM capacitor structure described herein can provide a first capacitance region having a high capacitance and a low Vmax (e.g., 1 volt), and a second capacitance region having low capacitance and a high Vmax (e.g., 2.5 volts or greater).

With reference now to FIG. 1, a MIM capacitor structure 100 is illustrated according to a non-limiting embodiment. The MIM capacitor structure 100 includes a substrate 102 extending along a first axis (e.g., an X-axis) to define a length, a second axis (e.g., a Y-axis) orthogonal to the first axis to define a width, and a third axis (e.g., a Z-axis) orthogonal to the first and second axes to define a height.

The substrate 102 includes a first capacitance region 104, a second capacitance region 106, and a shared region 108 interposed between the first capacitance region 104 and the second capacitance region 106. The first capacitance region 104 has a first capacitance and a first Vmax and the second capacitance region 106 has a second capacitance and a second Vmax different from the first capacitance and first Vmax. According to one or more non-limiting embodiments, the second capacitance region 106 has a second capacitance that is less than the first capacitance, but a Vmax that is greater than the first Vmax of the first capacitance region 104 as described in greater detail below. Although two capacitance regions 104 and 106 are described herein, it should be appreciated that the MIM capacitor structure 100 can include additional capacitance regions without departing from the scope of the invention.

The substrate further includes a first interlayer dielectric (ILD) 110, a nitride or carbon-doped nitride layer or a combination of oxide-nitride and/or carbon-doped nitride capping layer, (the so-called capping layer for Cu interconnect) 112, a second ILD 114, a first capacitor stack 116, a second capacitor stack 118, and a third ILD 120. The first ILD 110, second ILD 114 and third ILD 120 are each formed from various low-k dielectric materials including, but not limited to, silicon dioxide or other low-k materials having a dielectric constant less than 3.9.

The first ILD 110 contains one or more electrically conductive lower contacts 122 formed therein. The lower contacts 122 can be formed from a metal material such as, for example, copper (Cu). The capping layer 112 is formed on the upper surface of the first ILD 110. The capping layer 112 can be formed from various nitride or carbide-nitride and oxide material including, but not limited to, silicon nitride, carbon doped silicon nitride, aluminum nitride, aluminum oxide or a combination of them.

The first capacitor stack 116 is formed in the first capacitance region 104, and includes an alternating arrangement of conformal plate layers 124, 126, 128 and conformal insulator layers 130, 132. Likewise, the second capacitor stack 118 is formed the second capacitance region 106, and includes an alternating arrangement of conformal plate layers 124' and 128' and alternating insulator layers 130', 132'. The conformal plate layers 124, 126, 128 and 124' and 128' are formed from an electrically conductive material including metal. The conformal plate layers 124, 126, 128 and 124' and 128' have a thickness ranging, for example, from about 10 nm to about 500 nm. The conformal insulator layers 130, 132 and 130', 132' are formed from a high-k dielectric material including, but not limited to, zirconium dioxide ($ZrO_2$), hafnium oxide ($HfO_2$), and aluminum oxide ($Al_2O_3$), and combinations thereof. Other materials having a dielectric constant higher than 3.9 may also be used to form the conformal insulator layers 130 132 and 130', 132' without departing from the scope of the invention. The conformal insulator layers 130, 132 and 130', 132' have a thickness ranging, for example, from about 2 nanometers (nm) nm to about 10 nm.

The first capacitor stack 116 includes a first number of conformal plate layers, e.g., three plate layers 124, 126, 128, while the second capacitor stack includes a second number of conformal plate layers, e.g., 124' and 128'. Accordingly, the first number of conformal plate layers 124, 126, 128 formed in the first capacitance region 104 generates the first Vmax of the first capacitance region 104, while the second number of conformal plate layers 124', 126' formed in the second capacitance region 106.

According to the non-limiting embodiment illustrated in FIG. 1, the number of conformal plate layers 124, 126, 128 formed in the first capacitance region 104 is greater than the number of conformal plate layers 124' and 128' formed in the second capacitance region 106. Accordingly, the second capacitance region 106 provides a second Vmax that is greater than the first Vmax provided by the first capacitance region. Although the second capacitor stack 118 is described herein as having two conformal plate layers 124' and 128', a greater number of conformal plate layers can be included in the second capacitor stack 118 without departing from the scope of the invention. It should be appreciated, however, that the total number of conformal plate layers included in the second capacitor stack 118 should be less than the total conformal plate layers of the first capacitor stack 116 so that the MIM capacitor structure 100 can provide different capacitance regions with different Vmax levels, e.g., so that the second capacitance region 106 can provide a different Vmax (e.g., higher Vmax) compared to the first capacitance region 104.

The fabrication process flow described in greater detail results in the first capacitor stack 116 having a different arrangement of conformal plate layers 124, 126, 128 and conformal insulator layers 130, 132 compared to the arrangement of conformal plate layers 124' and 128' and conformal insulator layers 130', 132' included in the second capacitor stack 118. For example, the first capacitor stack 116 includes a first conformal insulator layer 130 extending across the entire length of the first capacitor stack 116, a second conformal insulator layer 132 extending across the entire length of the first capacitance region 116, and a first conformal plate layer 126 interposed between the first conformal insulator layer 130 and the second conformal insulator layer 132. The second capacitor stack 118, however, includes a first conformal insulator layer 130' extending across the entire length of the second capacitance region, and a second conformal insulator layer 132' formed directly on an upper surface of the first insulating layer 130' and extending across the entire length of the second capacitor stack 118. Therefore, the first and second conformal insulator layers 130' and 132' exclude a conformal plate layer disposed between them.

In addition, the fabrication process described herein results in a shared region 108, which includes portions of the conformal plate layer and conformal insulator layers used to form the first and second capacitor stacks 116 and 118. According to a non-limiting embodiment, the shared region 108 includes a first shared insulator layer 134 and a second shared insulator layer 136 formed directly on the upper surface of the first shared insulator layer 134.

The third ILD 120 covers and encases the first and second capacitor stacks 116 and 118. In addition, the third ILD 120 contains one or more electrically conductive upper contacts 140 formed therein. The upper contacts 140 can be formed from a metal material such as, for example, copper (Cu). Accordingly, one or more electrically conductive vias 142 can be formed in the MIM capacitor structure 100. Each via 142 extends from a corresponding upper contact 140, through the ILDs 110, 114, 120 and capacitor stacks 116, 118, and terminates on a corresponding lower contact 122. An upper capping layer 144 can then be deposited on the upper surface of the ILD 120 to cover the upper contacts 140. As described herein, the upper capping layer 144 can be formed from various oxide, nitride, carbide material including, but not limited to, silicon nitride, carbon doped silicon nitride, aluminum nitride, aluminum oxide or a combination of them.

FIGS. 2-14 illustrate a process flow of fabricating a MIM capacitor structure according to non-limiting embodiments of the present disclosure. Referring to FIG. 2, a MIM capacitor structure 100 is illustrated in an intermediate stage of fabrication according to a non-limiting embodiment of the present disclosure. In the present specification and claims, an "intermediate" semiconductor device is defined as a semiconductor device in a stage of fabrication prior to a final stage or prior to a fabricated a completed device. At this stage, the MIM capacitor structure 100 is illustrated following various intermediate processing operations to deposit a first conformal plate layer 124 on an upper surface of a first ILD 110. The first conformal plate layer 124 can be deposited using a physical vapor deposition (PVD) process, for example, and is shared between a first capacitance region 104 and second capacitance region 106. That is, the first conformal plate layer 124 is deposited simultaneously in the first and second capacitance regions 104 and 106.

Turning to FIG. 3, the MIM capacitor structure 100 is illustrated following deposition of a masking layer 200 on the upper surface of the first conformal plate layer 124. The masking layer can include a hardmask material including, but not limited to, silicon nitride (SiN).

Referring to FIG. 4, the MIM capacitor structure 100 is illustrated after patterning the masking layer 200. The masking layer 200 can be patterned using various photolithography techniques. For example, a pattern can be produced by applying a photoresist to the surface to be etched, exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an O2 ash process, or the patterned resist may be stripped using a wet chemical process. Accordingly, one or more openings 202 are formed that expose a portion of the underlying conformal plate layer 124.

Referring to FIG. 5, the MIM capacitor structure 100 is illustrated after removing the exposed portions of the underlying conformal plate layer 124. According to one or more non-limiting embodiments, reactive ion etch (RIE) process that is selective to the material of the first ILD 110. Accordingly, the exposed portions of the conformal plate layer 124 can be removed (i.e., patterned) to from a first conformal plate layer 124 corresponding to the first capacitance region 104 and a second conformal plate layer 124' corresponding to the second capacitance region 106.

Turning to FIG. 6, the MIM capacitor structure 100 is illustrated after removing the masking layer 200 and depositing a first conformal insulator layer 130. The first conformal insulator layer 130 can be deposited using a chemical vapor deposition (CVD) process. The first conformal insulator layer 130 lies on the upper surface of the initial plate layer 124 and conforms to the exposed materials defined by the openings 202. Accordingly, a first portion of the deposited first conformal insulator layer can serve as a first conformal insulator layer 130 corresponding to the first capacitance region 104 and a second portion of the deposited first conformal insulator layer can serve as a first conformal insulator layer 130' corresponding to the second capacitance region 106.

Referring to FIG. 7, the MIM capacitor structure 100 is illustrated following deposition of a second conformal plate layer 126 on the upper surface of the first conformal insulator layer 130. As described herein, the second conformal plate layer 126 can be deposited according to a PVD process.

With reference to FIG. 8, the MIM capacitor structure 100 is illustrated after patterning a masking layer 204 formed on the upper surface of the second conformal plate layer 126.

Accordingly, one or more targeted portions of the second conformal plate layer 126 are covered by the remaining masking layer 204, while other portions of the second conformal plate layer 126 are left exposed. According to a non-limiting embodiment, the masking layer 204 is completely removed from the second capacitance region 106, while a portion of the masking layer 204 is maintained in the first capacitance region 104. In this manner, the second conformal plate layer 126 can be completely removed from the second capacitance region, while one or more portions of the second conformal plate layer 126 can be maintained in the first capacitance region 104. As a result, a different number of conformal plate layers can be formed in the second capacitance region 106 compared to the first capacitance region, thereby decoupling the Vmax level of the second capacitance region 106 from the first capacitance region 104.

Turning to FIG. 9, the MIM capacitor structure 100 is illustrated after removing the exposed portions of the second conformal plate layer 126. According to one or more non-limiting embodiments, a RIE process that is selective to the material of the underlying conformal insulator layer 130 can be performed. In this manner, the exposed portions of the second conformal plate layer 126 can be removed while maintaining the underlying conformal insulator layer 130.

Figure 10:
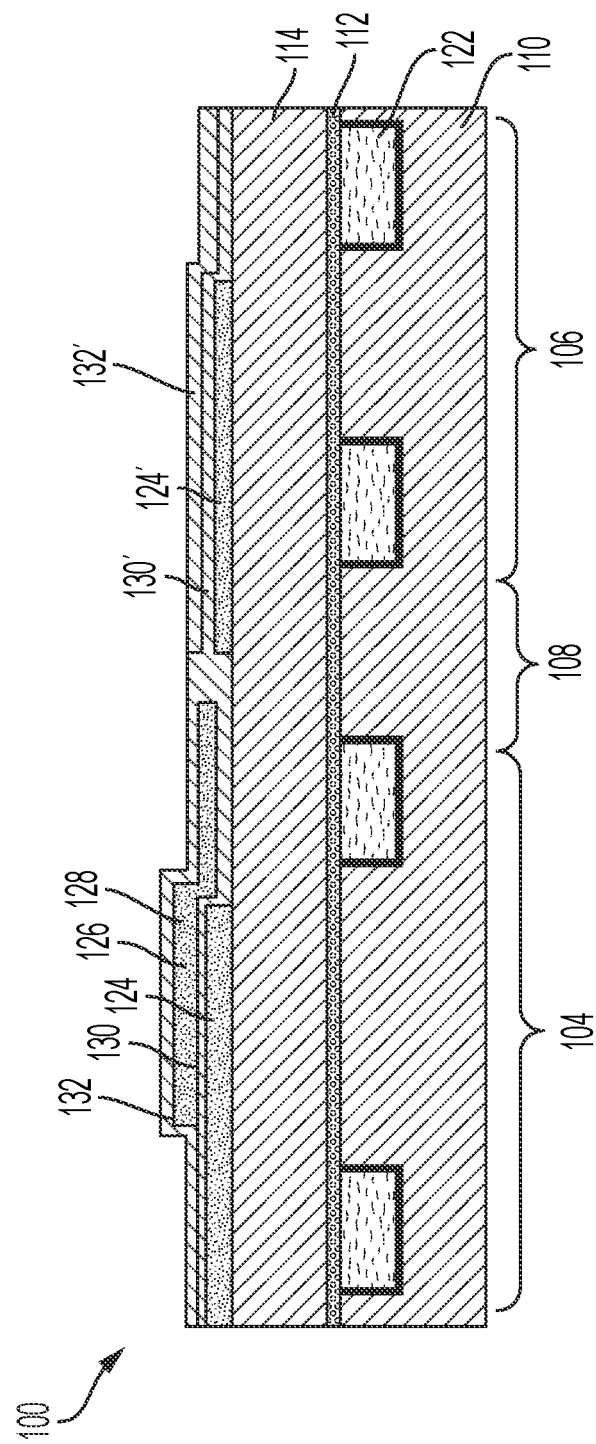

Turning now to FIG. 10, the MIM capacitor structure 100 is illustrated following deposition of a second conformal insulator layer 132. As described herein, the second conformal insulator layer 132 can be deposited using a CVD process. In this manner, the second conformal insulator layer 132 is formed such that it lines the upper surface of the first conformal insulator layer 130 and the remaining portions of the second conformal plate layer 126. Accordingly, a first portion of the deposited second conformal insulator layer can serve as a second conformal insulator layer 132 corresponding to the first capacitance region 104 and a second portion of the deposited second conformal insulator layer can serve as a second conformal insulator layer 132' corresponding to the second capacitance region 106.

At this stage of the process flow, the first capacitance region 104 begins to exhibit an arrangement of conformal plate layers 124, 126, 128 and conformal insulator layers 130, 132 that is different than the arrangement of conformal plate layers 124' and 128' and conformal insulator layers 130', 132' formed in the second capacitance region 106. For instance, the first capacitance region 104 includes a first conformal insulator layer 130 extending across the entire length of the first capacitance region 104, a second conformal insulator layer 132 extending across the entire length of the first capacitance region 104, and the second conformal plate layer 126 that is interposed between the first conformal insulator layer 130 and the second conformal insulator layer 132. The second capacitance region 106, however, includes a first conformal insulator layer 130' extending across the entire length of the second capacitance region, and a second conformal insulator layer 132' formed directly on an upper surface of the first insulating layer 130' and extending across the entire length of the second capacitance region 118. Thus, the fabrication process flow described herein results in the first and second conformal insulator layers 130' and 132' excluding a conformal plate layer disposed between them, thereby allowing the ability to selectively form a different number of conformal plate layers in the second capacitance region 106 compared to the first capacitance region 104 using a reduced number of processing steps compared to conventional MIM capacitor fabrication techniques.

Figure 11:
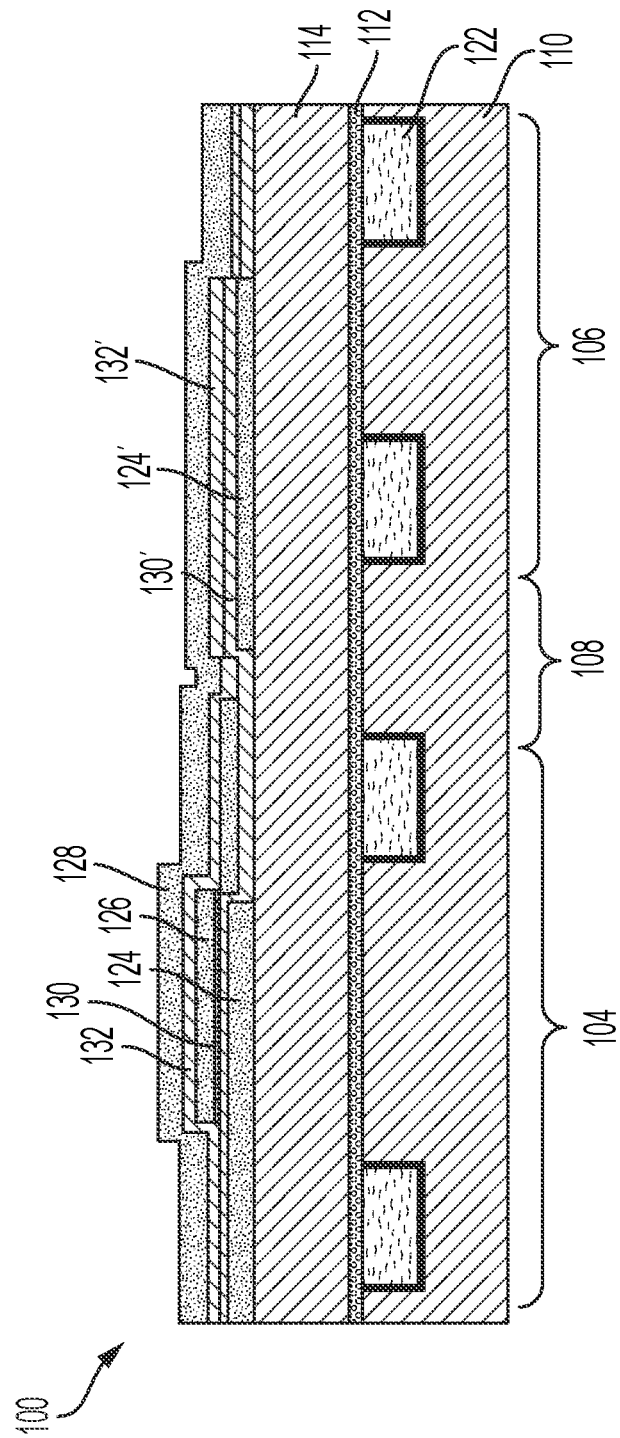

Referring now to FIG. 11, the MIM capacitor structure 100 is illustrated following deposition of a third conformal plate layer 128 on the upper surface of the second conformal insulator layer 132. As described herein, the third conformal plate layer 128 can be deposited using, for example, a PVD process.

Figure 12:
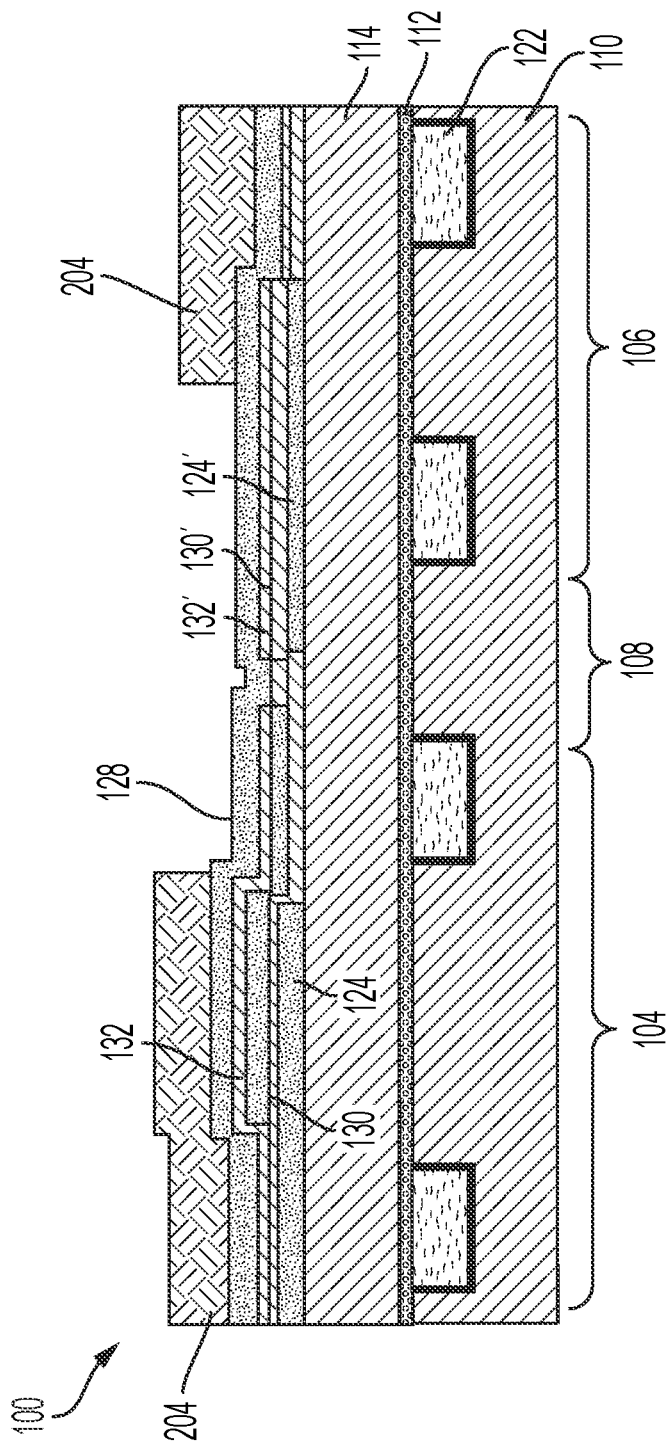
Figure 13:
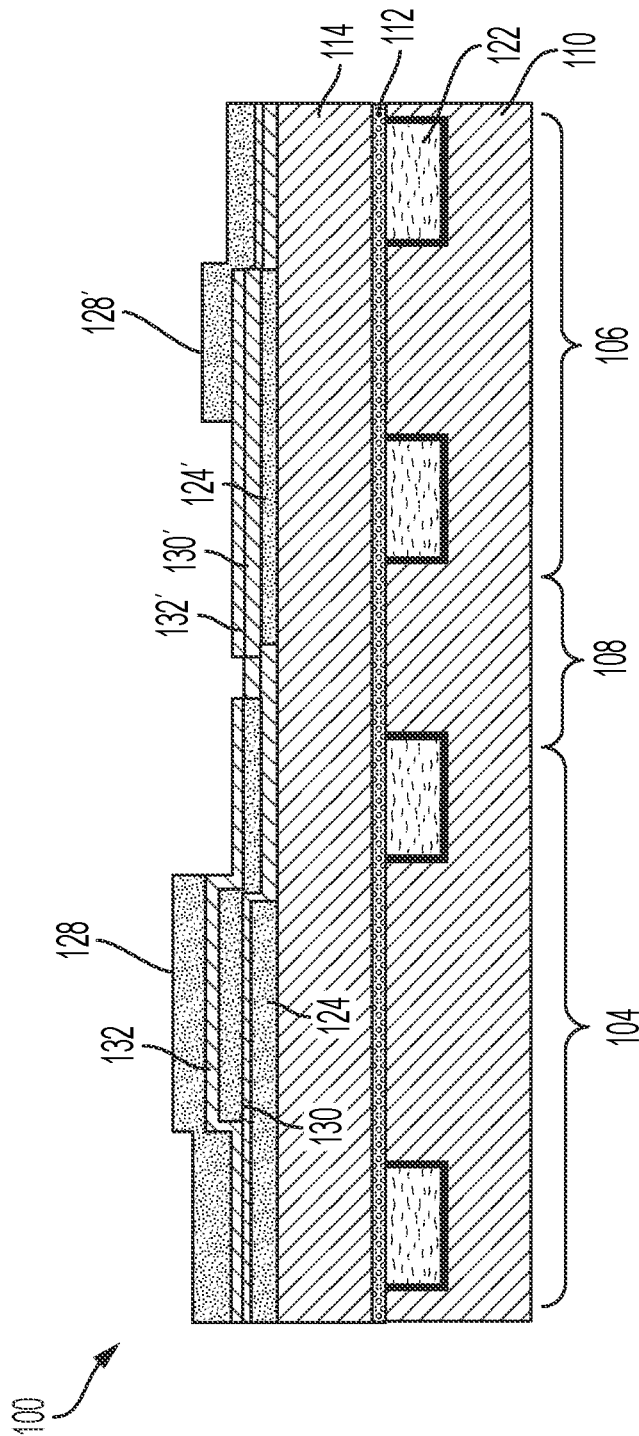

Turning now to FIG. 12, the MIM capacitor structure 100 is illustrated after patterning a masking layer 208 formed on the upper surface of the third conformal plate layer 128. Accordingly, one or more targeted portions of the third conformal plate layer 128 are covered by the remaining masking layer 208, while other portions of the third conformal plate layer 128 are left exposed Referring to FIG. 13, the MIM capacitor structure 100 is illustrated after removing the exposed portions of the third conformal plate layer 128. According to one or more non-limiting embodiments, a RIE process that is selective to the material of the underlying conformal insulator layer 132 can be performed. In this manner, the exposed portions of the third conformal plate layer 128 can be removed while maintaining the underlying conformal insulator layer 132.

Figure 14:
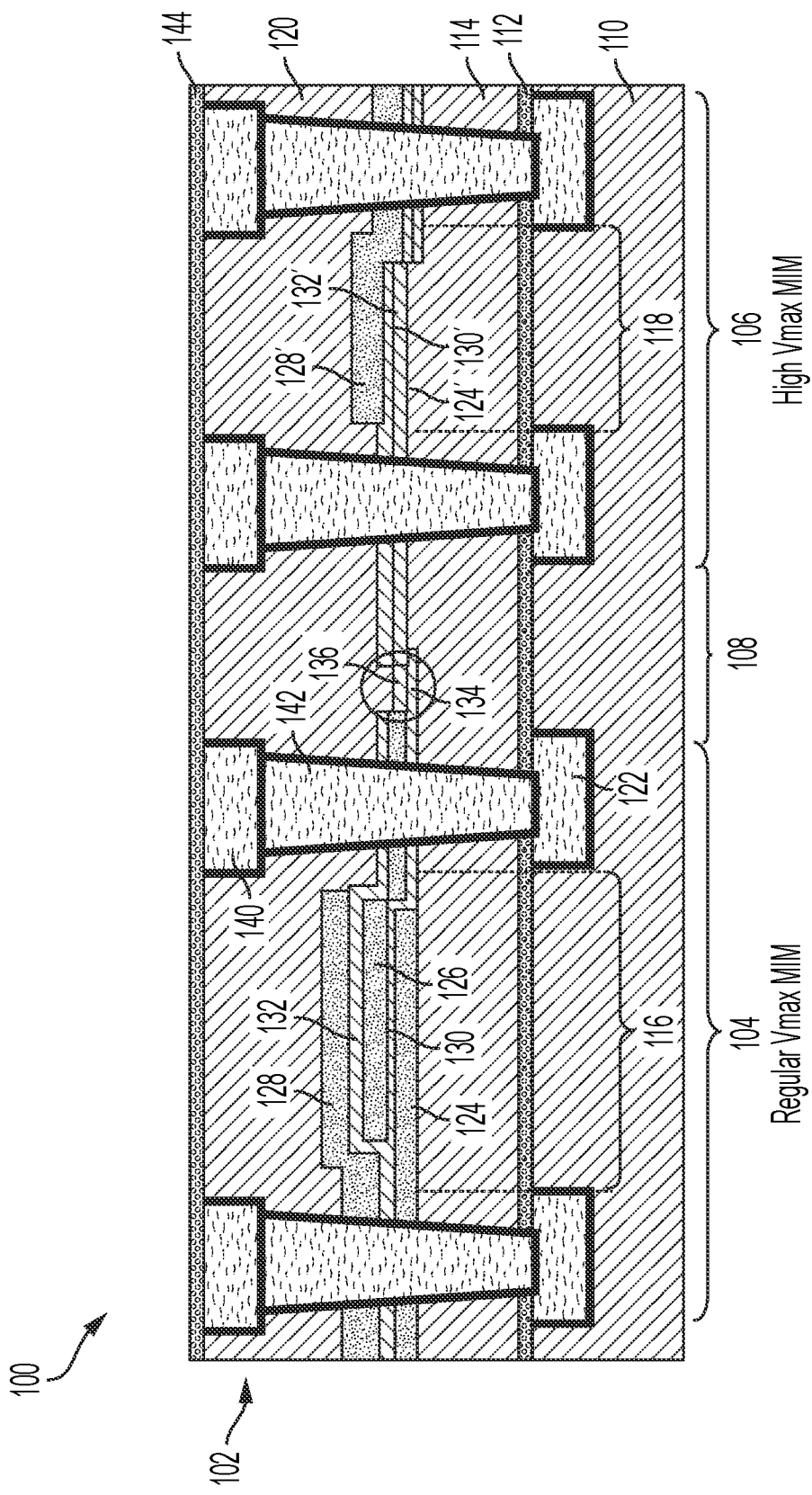

With reference now to FIG. 14, a completed MIM capacitor structure 100 is illustrated according to a non-limiting embodiment of the present disclosure. As described herein, the MIM capacitor structure 100 includes first and second capacitance regions 104 and 106 that are decoupled from one another. In other words, the first capacitance region 104 has a first Vmax and the second capacitance region has a second Vmax that is different from the first Vmax (e.g., i.e., greater than the first Vmax). In this manner, the MIM capacitor structure 100 can be employed in CMOS application that employ some circuits designed to operate according to a first Vmax (e.g., a low Vmax of about 1V), while other circuits are designed to operate according to a second Vmax (e.g., a higher Vmax of about 2.5V or greater).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a metal-insulator-metal (MIM) capacitor structure, the method comprising:
    forming a substrate including a first capacitance region and a second capacitance region;
    forming a first capacitor stack including a first number of conformal plate layers that produce a first maximum operating voltage (Vmax) in the first capacitance region; and
    forming a second capacitor stack including a second number of conformal plate layers which is different than the first number of conformal plate layers that produce a second Vmax in the second capacitance region, the second Vmax being different from the first Vmax,
    wherein forming the first and second capacitor stacks comprises:
        depositing a first conformal plate layer in the first capacitance region and the second capacitance region;
        selectively removing one or more portions of the first conformal plate layer;
        depositing a first conformal insulator layer on an upper surface of the first conformal plate layer, the first conformal insulator layer extending into the first capacitance region and the second capacitance region;
        depositing a second conformal plate layer on an upper surface of the first conformal insulator layer, the second conformal plate layer extending into the first capacitance region and the second capacitance region;
        removing a portion of the second conformal plate layer located in the first capacitance region, while completely removing the second conformal plate layer from the second capacitance region to expose the first conformal insulator plate layer; and
        depositing a second conformal insulator that covers the maintained portion of the second conformal plate layer located in the first capacitance region and the exposed first conformal insulator layer located in the second capacitance region.

2. The method of claim 1, wherein forming the first and second capacitor stacks comprise:
    forming a first alternating arrangement of conformal plate layers and conformal insulator layers in the first capacitance region to define the first capacitor stack; and
    forming a second alternating arrangement of conformal plate layers and conformal insulator layers in the second capacitance region to define the second capacitor stack.

3. The method of claim 2, wherein the second number of conformal plate layers is less than the first number of conformal plate layers.

4. The method of claim 3, wherein the first number of conformal plate layers produces the first Vmax and the second number of conformal plate layers produces the second Vmax that is greater than the first Vmax.

5. The method of claim 2, wherein the second conformal insulator layer located in the second capacitance region is directly on an upper surface of the first conformal insulator layer located in the second capacitance region.

6. The method of claim 5, wherein forming the first and second capacitor stacks further comprises depositing a third conformal plate layer that covers the second conformal insulator located in the first and second capacitance regions.

* * * * *